United States Patent
Krishnasamy et al.

(10) Patent No.: US 11,664,470 B2
(45) Date of Patent: May 30, 2023

(54) PHOTODIODE WITH INTEGRATED, SELF-ALIGNED LIGHT FOCUSING ELEMENT

(71) Applicant: GLOBALFOUNDRIES U.S. Inc., Malta, NY (US)

(72) Inventors: Rajendran Krishnasamy, Essex Junction, VT (US); Steven M. Shank, Jericho, VT (US); John J. Ellis-Monaghan, Grand Isle, VT (US); Ramsey Hazbun, Colchester, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 17/863,922

(22) Filed: Jul. 13, 2022

(65) Prior Publication Data
US 2022/0352401 A1    Nov. 3, 2022

Related U.S. Application Data

(63) Continuation of application No. 17/065,862, filed on Oct. 8, 2020, now Pat. No. 11,424,377.

(51) Int. Cl.
| | |
|---|---|
| *H01L 31/0352* | (2006.01) |
| *H01L 31/0232* | (2014.01) |
| *H01L 31/18* | (2006.01) |
| *H01L 31/103* | (2006.01) |
| *H01L 31/028* | (2006.01) |

(52) U.S. Cl.
CPC .... *H01L 31/035281* (2013.01); *H01L 31/028* (2013.01); *H01L 31/02327* (2013.01); *H01L 31/103* (2013.01); *H01L 31/1808* (2013.01)

(58) Field of Classification Search
CPC ....... H01L 31/035281; H01L 31/02327; H01L 31/028; H01L 31/103; H01L 31/1808
See application file for complete search history.

(56) References Cited

U.S. PATENT DOCUMENTS

| | | | |
|---|---|---|---|
| 2,557,110 | A | 6/1951 | Jaynes |
| 2,619,538 | A | 11/1952 | Grant |
| 3,787,871 | A | 1/1974 | Reese |
| 4,481,523 | A | 11/1984 | Osaka |

(Continued)

FOREIGN PATENT DOCUMENTS

| | | |
|---|---|---|
| EP | 1982356 | 3/2017 |
| KR | 20100070601 | 6/2010 |

(Continued)

OTHER PUBLICATIONS

Fossum et al., "A Review of the Pinned Photodiode for CCD and CMOS Image Sensors", IEEE Journal of the Electron Devices Society, May 2014, vol. 2, No. 3, 11 pages.

(Continued)

*Primary Examiner* — Sitaramarao S Yechuri
(74) *Attorney, Agent, or Firm* — Anthony Canale; Andrew M. Calderon; Calderon Safran & Cole, P.C.

(57) ABSTRACT

The present disclosure relates to semiconductor structures and, more particularly, to a photodiode with an integrated, light focusing elements and methods of manufacture. The structure includes: a trench photodiode comprising a domed structure; and a doped material on the domed structure, the doped material having a concave underside surface.

19 Claims, 4 Drawing Sheets

(56) References Cited

U.S. PATENT DOCUMENTS

| | | | |
|---|---|---|---|
| 4,799,031 | A | 1/1989 | Lang et al. |
| 4,847,210 | A * | 7/1989 | Hwang ............... H01L 27/1443 |
| | | | 257/E27.128 |
| 5,625,210 | A | 4/1997 | Lee et al. |
| 5,880,495 | A | 3/1999 | Chen |
| 5,994,724 | A * | 11/1999 | Morikawa ....... H01L 31/035281 |
| | | | 257/466 |
| 6,147,349 | A | 11/2000 | Ray |
| 6,180,945 | B1 | 1/2001 | Barton et al. |
| 6,218,210 | B1 | 4/2001 | Park |
| 6,921,934 | B2 | 7/2005 | Patkick |
| 7,002,429 | B2 | 2/2006 | Asao et al. |
| 7,361,526 | B2 | 4/2008 | Maa et al. |
| 7,397,101 | B1 | 7/2008 | Masini et al. |
| 7,618,839 | B2 | 11/2009 | Rhodes |
| 7,777,250 | B2 | 8/2010 | Lochtefeld |
| 7,790,495 | B2 | 9/2010 | Assefa et al. |
| 7,795,064 | B2 | 9/2010 | Pan et al. |
| 7,871,854 | B1 * | 1/2011 | Spencer ............... H01L 31/1804 |
| | | | 438/273 |
| 7,902,540 | B2 | 3/2011 | Cohen |
| 9,064,699 | B2 | 6/2015 | Wang et al. |
| 9,711,550 | B2 | 7/2017 | FaVennec et al. |
| 9,864,138 | B2 | 1/2018 | Coolbaugh et al. |
| 10,074,687 | B2 | 9/2018 | Kurokawa |
| 10,157,947 | B2 | 12/2018 | Chen et al. |
| 10,359,569 | B2 | 7/2019 | Dumais |
| 10,861,888 | B2 | 12/2020 | Na et al. |
| 11,004,878 | B2 | 5/2021 | Stamper et al. |
| 11,079,544 | B2 | 8/2021 | Bian et al. |
| 11,125,944 | B2 | 9/2021 | Bian et al. |
| 11,316,064 | B2 | 4/2022 | Adusumilli et al. |
| 2003/0030814 | A1 | 2/2003 | Osinski et al. |
| 2007/0099315 | A1 | 5/2007 | Maa et al. |
| 2008/0070355 | A1 | 3/2008 | Lochtefeld et al. |
| 2008/0257409 | A1 * | 10/2008 | Li ........................ H01L 31/047 |
| | | | 136/259 |
| 2011/0037133 | A1 | 2/2011 | Su et al. |
| 2012/0213468 | A1 | 8/2012 | Lipson et al. |
| 2013/0149806 | A1 * | 6/2013 | Kim .................... H01L 31/1804 |
| | | | 257/E31.127 |
| 2013/0241021 | A1 * | 9/2013 | Stenson ............... H01L 31/103 |
| | | | 257/E31.127 |
| 2014/0159183 | A1 | 6/2014 | Na |
| 2014/0185979 | A1 | 7/2014 | Evans et al. |
| 2014/0197507 | A1 * | 7/2014 | Assefa ............... H01L 31/0745 |
| | | | 438/69 |
| 2014/0217269 | A1 | 8/2014 | Guo et al. |
| 2015/0075599 | A1 | 3/2015 | Yu |
| 2015/0091065 | A1 * | 4/2015 | Wei ...................... H01L 31/028 |
| | | | 438/60 |
| 2015/0097256 | A1 * | 4/2015 | Ang .................. H01L 31/02327 |
| | | | 438/69 |
| 2015/0115333 | A1 | 4/2015 | Bobde et al. |
| 2016/0155884 | A1 | 6/2016 | Hon et al. |
| 2017/0365636 | A1 | 12/2017 | Mazzillo et al. |
| 2018/0204761 | A1 | 7/2018 | Feilchenfeld et al. |
| 2020/0020734 | A1 | 1/2020 | Wang et al. |
| 2020/0105812 | A1 | 1/2020 | Sze |
| 2021/0223478 | A1 * | 7/2021 | Song .................. H01L 31/02327 |
| 2021/0305313 | A1 * | 9/2021 | Pan .......................... H01L 33/44 |
| 2021/0305449 | A1 * | 9/2021 | Wang ..................... H01L 29/16 |
| 2021/0320217 | A1 | 10/2021 | Levy et al. |
| 2021/0376180 | A1 | 12/2021 | Adusumilli |
| 2022/0029032 | A1 | 1/2022 | Levy et al. |

FOREIGN PATENT DOCUMENTS

| | | |
|---|---|---|
| KR | 20100070610 | 6/2010 |
| WO | 0147034 | 6/2001 |

OTHER PUBLICATIONS

Yu, "High-Efficiency p-i-n Photodetectors on Selective-Area-Grown Ge for Monolithic Integration", IEEE Electron Device Letters, vol. 30, Issue 11, Nov. 2009, 4 pages.

Knoll, "High-Performance BiCMOS Si Photonics Platform", IEEE, 2015, 8 pages.

Liao et al., "36 GHz submicron silicon waveguide germanium photodetector", Optics Express, vol. 19, Issue 11, May 20, 2011, 6 pages.

Huang et al., "Germanium on Silicon Avalanche Photodiode", IEEE Journal of Selected Topics in Quantum Electronics vol. 24, No. 2, Mar./Apr. 2018, 11 pages.

Jutzi et al., "Ge-on-Si Vertical Incidence Photodiodes With 39-GHz Bandwidth", IEEE Photonics Technology Letters, vol. 17, Issue 7, Jul. 2005, 3 pages.

Koester et al., "Germanium-0n-Insulator Photodetectors", IEEE, Oct. 2005, 3 pages.

German Office Action dated Jul. 29, 2022 in related Application No. 10 2021 122 575.2, 6 pages.

English Translation of the German Office Action dated Jul. 29, 2022 in related Application No. 10 2021 122 575.2, 1 page.

Office Action in U.S. Appl. No. 16/935,854 dated Sep. 2, 2022, 11 pages.

Response to Office Action in U.S. Appl. No. 16/935,854 dated Oct. 25, 2022, 12 pages.

Notice of Allowance in U.S. Appl. No. 16/935,854 dated Dec. 13, 2022, 9 pages.

\* cited by examiner

PHOTODIODE WITH INTEGRATED, SELF-ALIGNED LIGHT FOCUSING ELEMENT

FIELD OF THE INVENTION

The present disclosure relates to semiconductor structures and, more particularly, to a photodiode with integrated, light focusing elements and methods of manufacture.

BACKGROUND

A photodiode is a semiconductor device that converts light into an electrical current. Photodiodes may contain optical filters, built-in lenses, and may have large or small surface areas depending on the specific application. Photodiodes can be used in many different optical applications. For example, germanium (Ge) photodiodes can be used for state of the art LIDAR applications due to their higher absorption compared to silicon (Si). In this way, smaller pixel size and active area can be realized. In such implementations, signal to noise (S/N) ratio is reduced by inefficient coupling to the absorber and cross-talk is increased with a smaller pitch.

A microlens can be used to focus light into the photodiode material. The microlens, though, is separated from the absorber by a non-absorbing optical path (e.g., polymer microlens in back end of the line (BEOL) stack). This can result in loss or degradation of the light, in addition to requiring extra fabricating steps which add to the overall cost of the structure.

SUMMARY

In an aspect of the disclosure, a structure comprises: a trench photodiode comprising a domed structure; and a doped material on the domed structure, the doped material having a concave underside surface.

In an aspect of the disclosure, a structure comprises: a trench photodiode extending into a well region of a semiconductor substrate and comprising a domed structure at its upper end; a doped material on the domed structure extending to a side of the trench photodiode; a first contact in electrical contact with the doped material; and a second contact in electrical contact with the well region of the semiconductor substrate.

In an aspect of the disclosure, a method comprises: forming a trench photodiode in a trench structure, the trench photodiode comprising an integrated domed structure; forming a doped material on the integrated domed structure and extending to a side of the trench photodiode, the doped material having a concave underside surface; and forming a contact in electrical contact to the doped material on the side of the trench photodiode.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
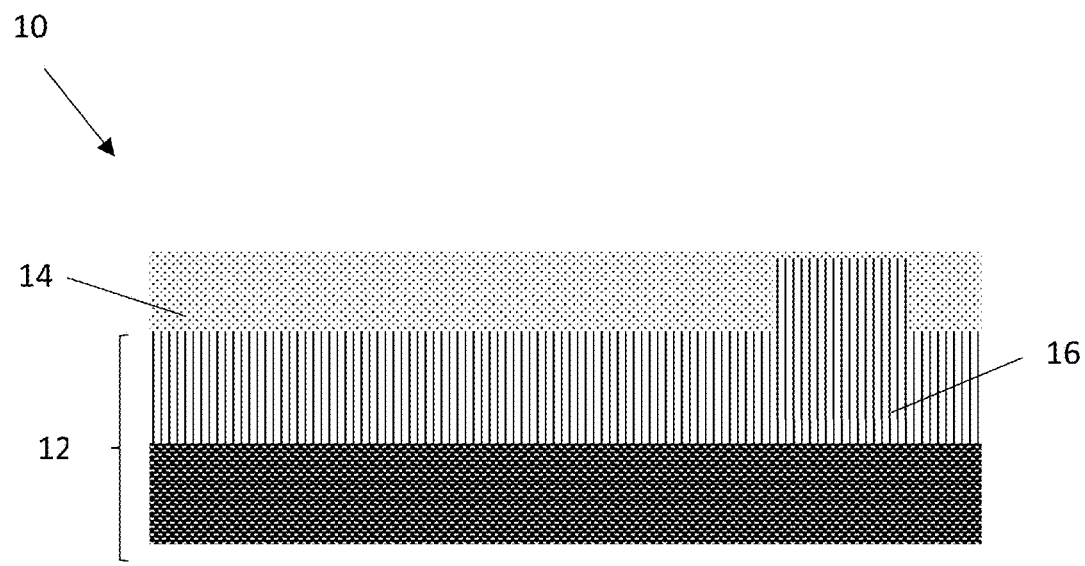
FIG. 1 shows a substrate with shallow trench isolation structures, amongst other features, and respective fabrication process in accordance with aspects of the present disclosure.

The present disclosure relates to semiconductor structures and, more particularly, to a photodiode with integrated, light focusing elements and methods of manufacture. More specifically, the present disclosure is directed to deep trench photodiodes with an aligned light focusing elements. In embodiments, the deep trench photodiode is a deep trench Ge photodiode and the light focusing element is aligned with the deep trench photodiode. The light focusing element includes a domed structure fully integrated with and using the same material as the deep trench photodiode. Advantageously, the integrated focusing element enables small active area pixel arrays with improved signal to noise (S/N) ratio and isolation.

In embodiments, the photodiode is a trench photodiode with a domed structure (e.g., convex) fully integrated and aligned with the photodiode, itself. The domed structure is covered by a doped polysilicon material and an optional dielectric material, e.g., SiN, resulting in a concave layered structure over the domed structure. The combination of the domed structure and concave material(s) result in a focusing element aligned to the trench photodiode or pixel element. That is, the focusing element comprises a combination of polysilicon material, dielectric material, and the domed structure, with the dielectric and polysilicon materials having a concave, underside surface and the domed material having a convex, upper surface.

In embodiments, the trench photodiode and domed structure comprise Ge based material. Also, the photodiode is provided in a doped well region formed in bulk Si material. The polysilicon material can be doped with an opposite polarity from the doped well region of the bulk Si material; although other doping arrangements are also contemplated herein as described below. The poly silicon material extends to a side of the photodiode for contact formation to the photodiode. In this way, the contact will not be directly over the photodiode and, hence, does not block light from entering into the photodiode. In alternative implementations, though, the contact can be directly on the domed structure. In further embodiments, the domed structure can be surrounded by shallow trench isolation material, over the doped well region. An array of focusing elements can also be provided.

The photodiode structures of the present disclosure can be manufactured in a number of ways using a number of different tools. In general, though, the methodologies and tools are used to form structures with dimensions in the micrometer and nanometer scale. The methodologies, i.e., technologies, employed to manufacture the photodiode structures of the present disclosure have been adopted from integrated circuit (IC) technology. For example, the structures are built on wafers and are realized in films of material patterned by photolithographic processes on the top of a wafer. In particular, the fabrication of the photodiode structures uses three basic building blocks: (i) deposition of thin films of material on a substrate, (ii) applying a patterned mask on top of the films by photolithographic imaging, and (iii) etching the films selectively to the mask.

FIG. 1 shows a substrate with shallow trench isolation structures, amongst other features, and respective fabrication process in accordance with aspects of the present disclosure. More specifically, the structure 10 of FIG. 1 includes a semiconductor substrate 12 with shallow trench isolation structures 14. In embodiments, the semiconductor substrate 12 is a substrate composed of bulk semiconductor material. The bulk semiconductor substrate 12 can be a high resistivity substrate composed of Si material; although other bulk materials used in photodiode implementations are contemplated herein.

The shallow trench isolation structures 14 can be formed by conventional lithography, etching and deposition methods known to those of skill in the art. For example, a resist formed over the semiconductor substrate 12 is exposed to energy (light) to form a pattern (opening). An etching process with a selective chemistry, e.g., reactive ion etching (RIE), will be used to form one or more trenches in the semiconductor substrate 12 through the openings of the resist. Following the resist removal by a conventional oxygen ashing process or other known stripants, insulator material, e.g., $SiO_2$, can be deposited in the trenches by any conventional deposition processes, e.g., chemical vapor deposition (CVD) processes. Any residual insulator material on the surface of the semiconductor substrate 12 can be removed by conventional chemical mechanical polishing (CMP) processes.

Still referring to FIG. 1, the semiconductor substrate 12 is subjected to an ion implantation process to form a doped well region 16. In embodiments, the well region 16 can be doped with a same dopant type and polarity as the bulk semiconductor substrate 12 to reduce its resistivity. For example, a P-well is doped with p-type dopants, e.g., Boron (B), and an N-well is doped with n-type dopants, e.g., Arsenic (As), Phosphorus (P) and Sb, among other suitable examples.

To perform the ion implantation process, a patterned implantation mask is used to define selected areas exposed for the implantations. The implantation mask may include a layer of a light-sensitive material, such as an organic photoresist, applied by a spin coating process, pre-baked, exposed to light projected through a photomask, baked after exposure, and developed with a chemical developer. the implantation masks has a thickness and stopping power sufficient to block masked areas against receiving a dose of the implanted ions. The implantation mask used to select the exposed area for forming the well region 16 is stripped after implantation.

Figure 2:
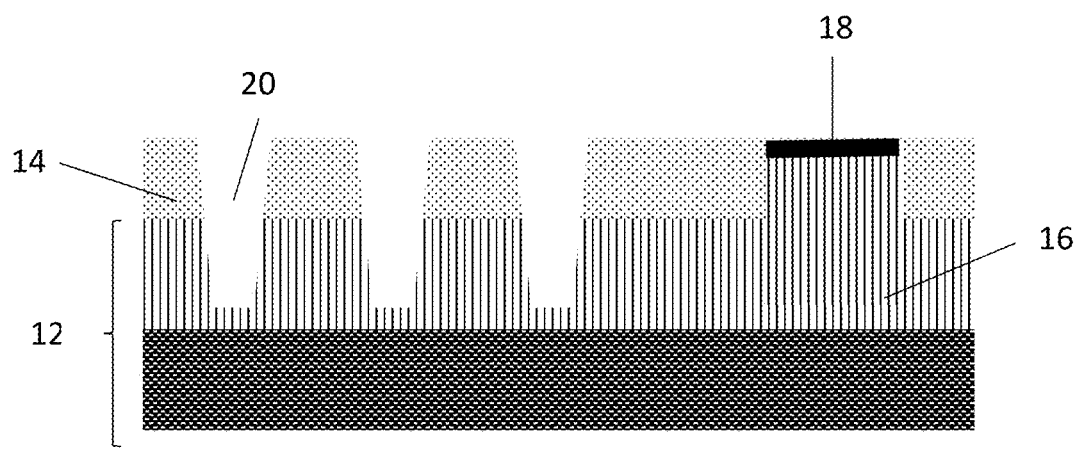
FIG. 2 shows trenches formed in the substrate, amongst other features, and respective fabrication process in accordance with aspects of the present disclosure.

In FIG. 2, an exposed area of the semiconductor substrate 12, e.g., well region 16, between the shallow trench isolation structures 14 is subjected to a silicide process. As should be understood by those of skill in the art, the silicide process begins with deposition of a thin transition metal layer, e.g., nickel, cobalt or titanium, over the exposed well region 16. After deposition of the material, the structure is heated allowing the transition metal to react with exposed silicon (or other semiconductor material as described herein) forming a low-resistance transition metal silicide. Following the reaction, any remaining transition metal is removed by chemical etching, leaving silicide contact 18.

Still referring to FIG. 2, following the silicide process, deep trenches 20 are formed in the semiconductor substrate 12. In the structure shown in FIG. 2, the deep trenches 20 extend to within the well region 16; however, it should be understood by those of skill in the art that the deep trenches 20 can extend to within the undoped region of the semiconductor substrate 12. For example, the deep trenches 20 can have a depth of 0.3 µm to 10.0 µm and beyond. In embodiments, the deep trenches 20 can be formed by conventional lithography and etching processes as already described herein. The deep trenches 20, as seen from a top down view, can have different cross-sectional shapes such as circular, square, rectangular, oval, diamond, etc.

Figure 3:
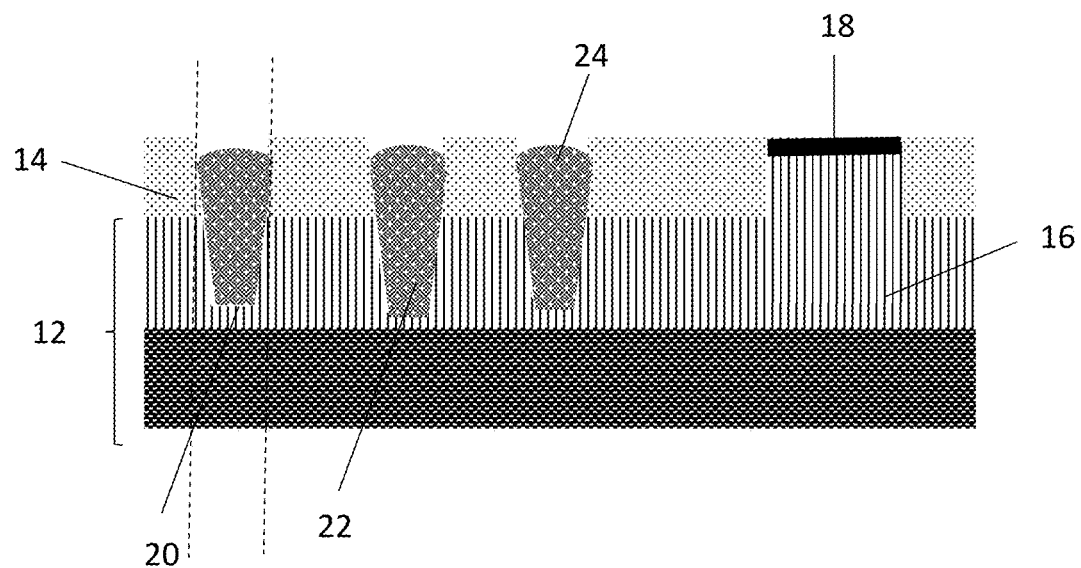
FIG. 3 shows trench photodiodes each with a domed structure, amongst other features, and respective fabrication process in accordance with aspects of the present disclosure.

FIG. 3 shows trench photodiodes each with a domed structure, amongst other features, and respective fabrication process. More specifically, the trench photodiodes are formed from an epitaxial semiconductor material 22 using an epitaxial growth process within the deep trenches 20. In embodiments, the epitaxial growth process will grow the epitaxial semiconductor material 22 on the exposed surfaces of the semiconductor substrate 12 within the deep trenches 20. From a top down view, the epitaxial semiconductor material 22 can take the shape of the deep trenches 20, e.g., circular, square, rectangular, oval, diamond, etc.

In embodiments, the epitaxial growth process can be modulated to include a domed structure 24 of the epitaxial semiconductor material 22. In embodiments, the domed structure 24 is convex and fully integrated and aligned with the trench photodiodes, e.g., epitaxial semiconductor material 22, as shown by the dashed lines. The alignment may be a result of growing the domed structure 24 and the epitaxial semiconductor material 22 of the trench photodiodes within the same deep trench, e.g., both of which extend to the same sidewalls of the deep trench as shown by the dashed lines. As the domed structure 24 is epitaxially grown with the material from the epitaxial semiconductor material 22, the domed structure aligns itself with the sidewalls of the trench and becomes fully integrated with the epitaxial semiconductor material 22 in the deep trench.

Similar to the epitaxial semiconductor material 22, from a top down view, the domed structure 24 can take on the shape of the deep trenches 20, e.g., circular, square, rectangular, oval, diamond, etc. The epitaxial semiconductor material 22 and integrated domed structure 24 can be Ge material; although other highly light absorbing material compounds are also contemplated herein. For example, other materials include, but are not limited to, SiGe, SiGeSn or GeSn. In further embodiments, the epitaxial semiconductor material 22 and integrated domed structure 24 can be doped with boron, in an in-situ process (or, in further embodiments, any p- or n-type dopant).

The domed structure 24 will be used to form a fully integrated, focusing element that is aligned with the photodiode material 22. And, by growing the domed structure 24 of the epitaxial semiconductor material directly on the photodiode material 22, the domed structure 24 will self-align to the photodiode material 22, hence being a fully integrated, self-aligned focusing element. The domed structure 24 can be optimized through the epitaxial growth process by modulating the pressure, relationship of growth time to pixel dimensions and/or temperature parameters. For example, pressures in the range of 1 µT to 760 T and temperatures in the range of 100° C. to 900° C. This pressure and temperature range contemplates a full range of UHVCVD, RP-CVD, and molecular-beam epitaxy (MBE)

growth processes, as is known in the art. In further embodiments, the epitaxial growth process can result in the domed structure 24 being at, below or above a surface of the shallow trench isolation structures 14. Alternatively, the domed structure 24 can be provide by a crystallographic etch process after the epitaxial growth process.

Figure 4:
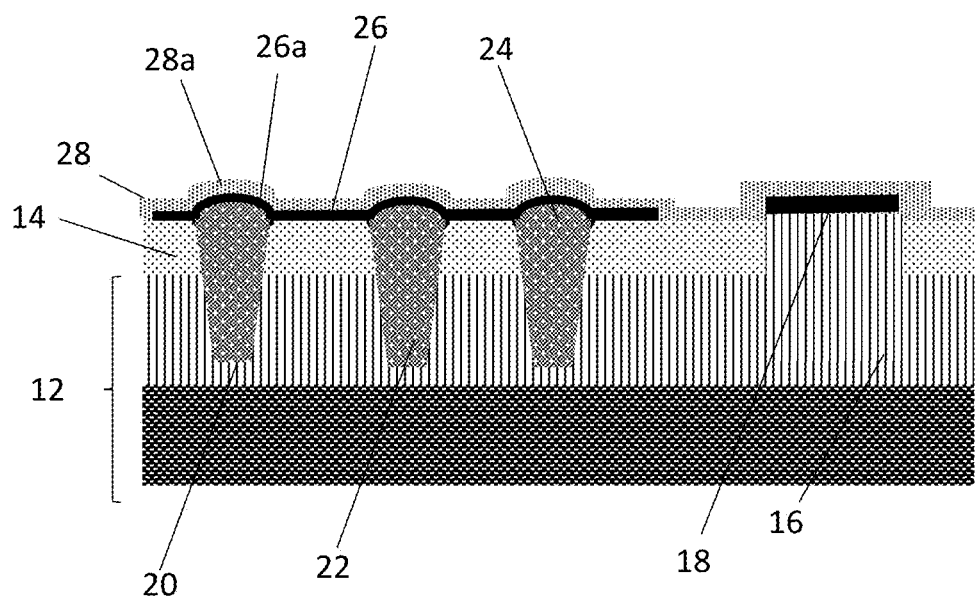
FIG. 4 shows material with concave features on the domed structure, amongst other features, and respective fabrication process in accordance with aspects of the present disclosure.

FIG. 4 shows material with concave features on the domed structure 24, amongst other features. Following the epitaxial process, a DHF cleaning process can be used to remove the native oxide formed on the Ge photodiode material. Alternatively, if the Ge epitaxial process includes an in situ deposited Si cap, the DHF cleaning process removes the native oxide formed on the Si cap. Subsequent to the DHF cleaning process, in this example, a polysilicon material 26 is formed, e.g., deposited, over the domed structure and other exposed surfaces. The polysilicon material 26 is a doped polysilicon material comprising a polarity that is opposite to the well region 16. For example, the well region 16 can have a p-type dopant; whereas, the polysilicon material 26 has a n-type dopant. In alternative embodiments, though, the polarity of the dopant can be the same for the well region 16 and the polysilicon material 26.

The polysilicon material 26 can be deposited by a CVD process or plasma vapor deposition (PVD) process (both of which can include in-situ doping) to a thickness of about 50 nm to 2 microns, although other dimensions are contemplated herein. The deposition of the polysilicon material 26 over the domed structure 24 results in a concave underside surface 26a, directly over and in contact with the domed structure 24.

Following the deposition process, the polysilicon material 26 is subjected to a patterning process through a conventional lithography and etching process with a selective chemistry. The patterning process leaves polysilicon material 26 extending on a side of the photodiode material 22. The polysilicon material 26 extending to the side of the photodiode material 22 may have a planar surface used for contact formation to the photodiode material 22. In this way, a contact can be on the side of the photodiode and not interfere or block light entering into the photodiode.

Still referring to FIG. 4, an optional dielectric material 28, e.g., SiN or other anti-reflective material, is deposited over the polysilicon material 26 which also extends over the silicide contact 18. Similar to the polysilicon material 26, the dielectric material 28 can be deposited by a CVD process or PVD process that also results in a concave underside surface 28a. In this embodiment, the combination of the domed structure 24, concave polysilicon material 26a and concave dielectric material 28a form an aligned focusing element fully integrated with the photodiode, e.g., material 22. In optional embodiments, without the dielectric material 28, the combination of the domed structure 24 and concave polysilicon material 26a forms the self-aligned focusing element fully integrated with the deep photodiode, e.g., material 22.

Figure 5:
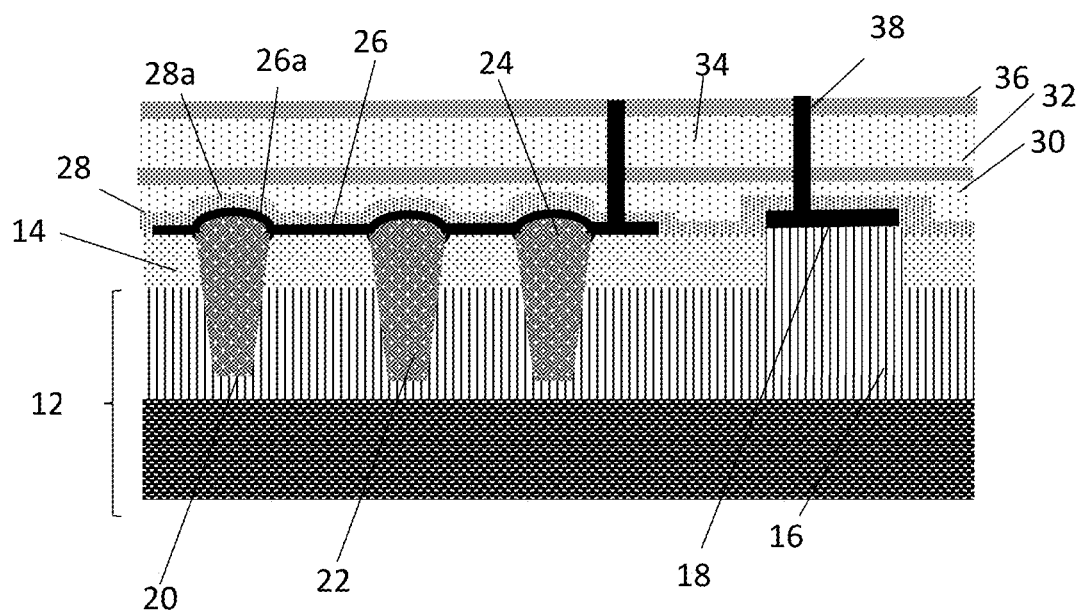
FIG. 5 shows contacts to the photodiode structure, amongst other features, and respective fabrication process in accordance with aspects of the present disclosure.

FIG. 5 shows contacts 38 contacting to the photodiode structure. More specifically, as shown in FIG. 5, the contacts 38 land on the silicide contact 18 and the polysilicon material 26 on the side of the photodiode material 22. The contacts 38 can be formed by conventional lithography, etching and deposition methods used for fabricating back end of the line (BEOL) stacks as should be understood by those of skill in the art.

For example, after deposition of dielectric materials 30, 32, 34, 36, a trench is formed in these materials by lithography and etching processes. The dielectric materials 30, 32, 34, 36 can be any anti-reflective materials such as a combination of $SiO_2$ and $SiN_3$ in various sequences and orders used in BEOL stacks as should be known to this of skill in the art. The first dielectric material 30, e.g., $SiO_2$, can also have a concave underside surface, with a top planar surface. The remaining layers 32, 34, 36 may have planar surfaces. A conductive material, e.g., aluminum or tungsten, can be deposited within the trenches to form the contacts 38. Any excess conductive material can be removed by a CMP process.

Figure 6:
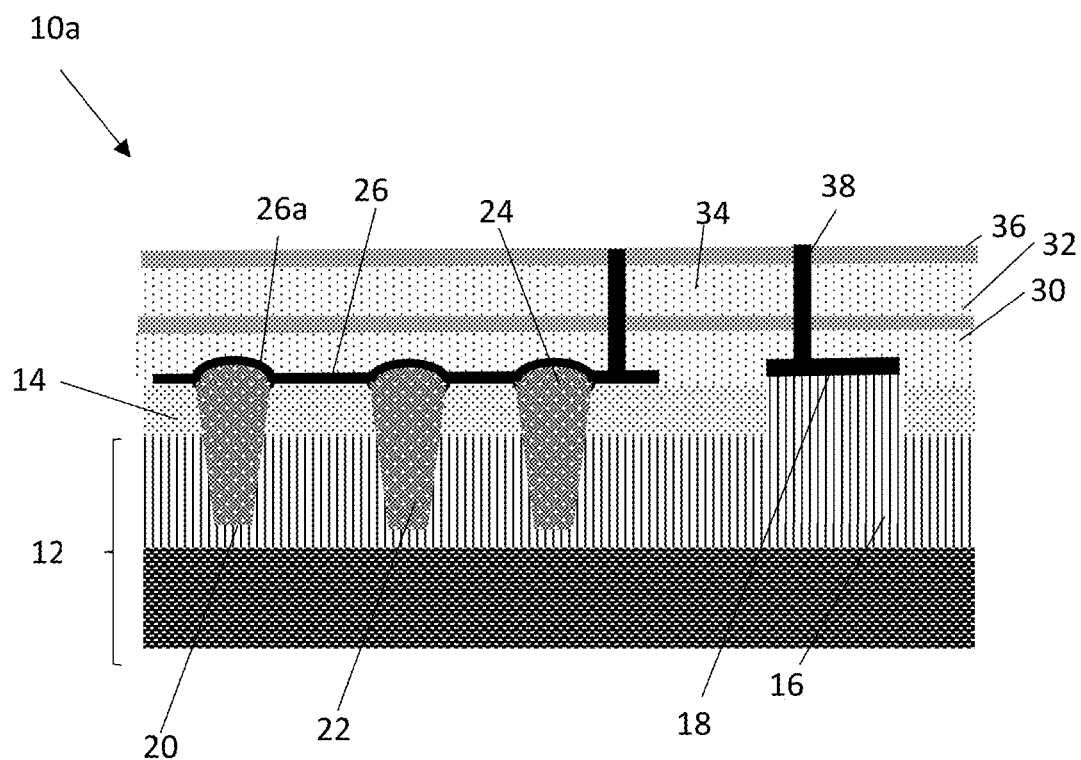
FIGS. 6-8 show alternative photodiode structures in accordance with additional aspects of the present disclosure.
Figure 7:
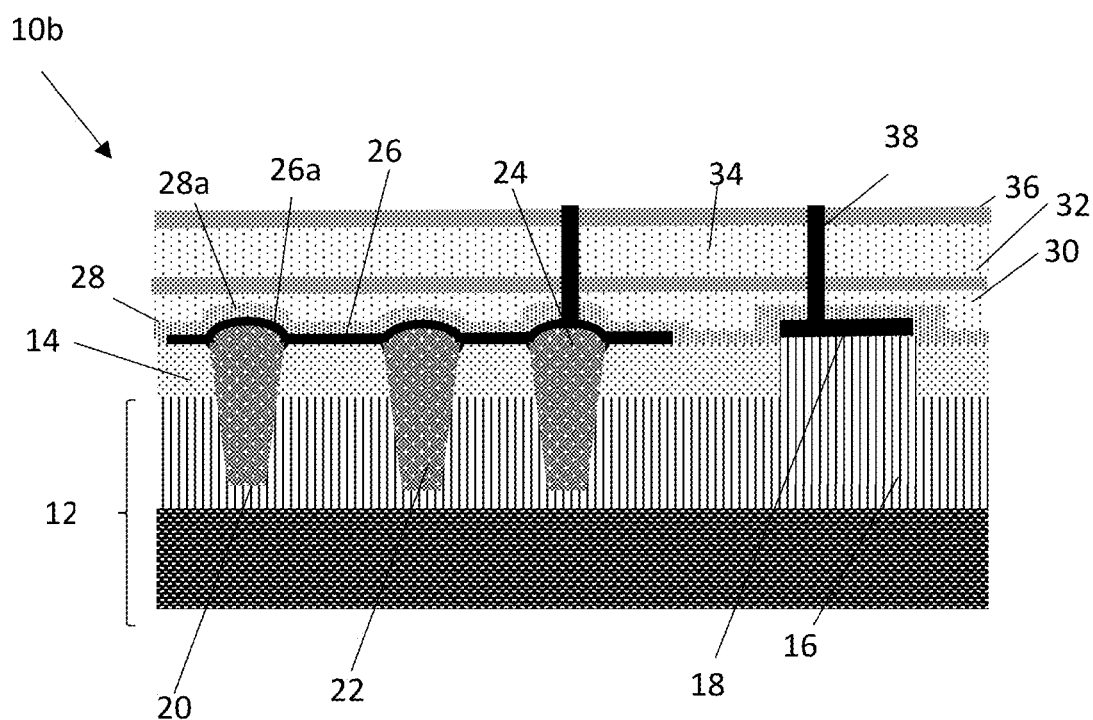
Figure 8:
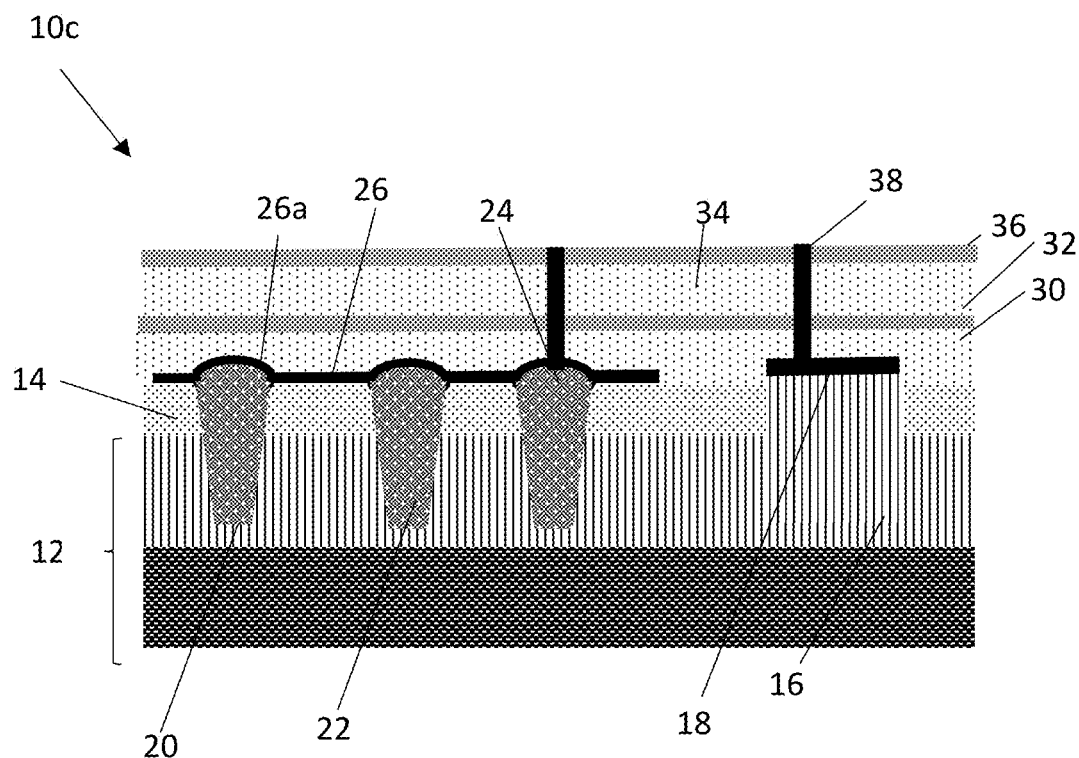

FIGS. 6-8 show alternative photodiode structures in accordance with additional aspects of the present disclosure. For example, the structure 10a of FIG. 6 shows the photodiode structure without the optional material 28. In the structure 10b of FIG. 7, the photodiode structure has the contact 38 directly above the fully integrated focusing element, e.g., above the domed structure 24. In the structure 10c of FIG. 8, the photodiode structure has the contact 38 directly above the self, aligned fully integrated focusing element, e.g., above the domed structure 24, but without the optional material 28. The remaining features of each of these structures are the same as described with reference to FIG. 5, for example.

The photodiode with focusing structures can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A structure comprising:
    a substrate material comprising a doped well region;

shallow trench isolation structures above the doped well region; and a trench photodiode comprising sidewalls contacting the doped well region and an upper surface extending above a top surface of the shallow trench isolation structures.

2. The structure of claim 1, wherein the trench photodiode comprises a domed structure.

3. The structure of claim 2, further comprising a doped material on the domed structure, the doped material having a concave underside surface.

4. The structure of claim 3, wherein the doped material and the doped well region have opposite polarities.

5. The structure of claim 4, wherein the doped material comprises a polysilicon material that extends to a side of the trench photodiode and a contact lands on the poly silicon material on the side of the trench photodiode.

6. The structure of claim 4, further comprising a non-reflective dielectric material on the doped material which comprises an underside surface with a concave surface.

7. The structure of claim 6, wherein the domed structure in combination with the doped material and the non-reflective dielectric material comprise a focusing element aligned and integrated with the trench photodiode.

8. The structure of claim 2, wherein the domed structure is aligned and fully integrated with the trench photodiode, which comprises a light absorbing material.

9. The structure of claim 8, wherein the light absorbing material comprises a Ge based material.

10. The structure of claim 2, wherein the domed structure is surrounded by and contacts the shallow trench isolation structures, and a portion of the doped well region extends between additional shallow trench isolation structures, a top surface of which is silicided, and further comprising a first contact to the silicide and a second contact to the trench photodiode, the first contact and the second contact extending through interlevel dielectric material.

11. A structure comprising:
shallow trench isolation structures on a well region of a semiconductor substrate;

a trench photodiode having sidewalls contacting the well region of the semiconductor substrate and extending to a top surface of the shallow trench isolation structures; and a doped material extending to a side of the trench photodiode over the shallow trench isolation structures.

12. The structure of claim 11, wherein the trench photodiode comprises a domed structure at its upper end.

13. The structure of claim 12, wherein the domed structure is aligned and integrated with the trench photodiode.

14. The structure of claim 12, wherein the domed structure comprises a convex surface and the doped material comprises a concave underside surface, the doped material directly contacting a top surface of the shallow trench isolation structures on a side of the domed structure.

15. The structure of claim 11, wherein trench photodiode comprises a Ge based material.

16. The structure of claim 11, wherein the doped material and the well region have opposite polarities and a portion of the well region extends between additional shallow trench isolation structures, a top surface of which is silicided, and further comprising a first contact to the silicide and a second contact to the trench photodiode, the first contact and the second contact extending through interlevel dielectric material.

17. The structure of claim 11, wherein the doped material comprises poly silicon material that has a polarity opposite to that of the well region.

18. The structure of claim 17, further comprising a non-reflective dielectric material on the polysilicon material, wherein the non-reflective dielectric material comprises an underside concave surface.

19. A method comprising:
forming shallow trench isolation structures on a well region of a semiconductor substrate;

forming a trench photodiode having sidewalls contacting the well region of the semiconductor substrate and extending above a top surface of the shallow trench isolation structures; and forming a doped material extending to a side of the trench photodiode over the shallow trench isolation structures.

* * * * *